US008188448B2

(12) United States Patent
Benveniste et al.

(10) Patent No.: US 8,188,448 B2
(45) Date of Patent: May 29, 2012

(54) TEMPERATURE CONTROLLED ION SOURCE

(75) Inventors: Victor Benveniste, Lyle, WA (US); Bon-Woong Koo, Andover, MA (US); Shardul Patel, North Reading, MA (US); Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 299 days.

(21) Appl. No.: 12/754,381

(22) Filed: Apr. 5, 2010

(65) Prior Publication Data

US 2011/0240878 A1 Oct. 6, 2011

(51) Int. Cl.
*G21K 5/10* (2006.01)

(52) U.S. Cl. ................. 250/492.21; 250/492.1

(58) Field of Classification Search ........... 250/492.1, 250/492.21, 426; 438/510, 513
See application file for complete search history.

(56) References Cited

U.S. PATENT DOCUMENTS

| | | | | |
|---|---|---|---|---|
| 5,641,707 A | * | 6/1997 | Moslehi | 438/513 |
| 5,707,486 A | * | 1/1998 | Collins | 156/345.49 |
| 5,866,472 A | * | 2/1999 | Moslehi | 438/513 |
| 5,879,574 A | * | 3/1999 | Sivaramakrishnan et al. | 216/60 |
| 5,935,334 A | * | 8/1999 | Fong et al. | 118/723 ME |
| 7,291,545 B2 | * | 11/2007 | Collins et al. | 438/510 |
| 7,479,644 B2 | * | 1/2009 | Ryding et al. | 250/491.1 |
| 7,488,958 B2 | * | 2/2009 | Huang | 250/492.21 |
| 2006/0138353 A1 | * | 6/2006 | Sasaki et al. | 250/492.21 |
| 2009/0014667 A1 | * | 1/2009 | Hahto et al. | 250/492.21 |
| 2010/0055345 A1 | * | 3/2010 | Biloiu et al. | 427/569 |
| 2010/0320395 A1 | * | 12/2010 | Hahto et al. | 250/426 |

* cited by examiner

*Primary Examiner* — Nikita Wells
*Assistant Examiner* — Johnnie L Smith

(57) ABSTRACT

An ion source is provided that utilizes the same dopant gas supplied to the chamber to generate the desired process plasma to also provide temperature control of the chamber walls during high throughput operations. The ion source includes a chamber having a wall that defines an interior surface. A liner is disposed within the chamber and has at least one orifice to supply the dopant gas to an inside of the chamber. A gap is defined between at least a portion of the interior surface of the chamber wall and the liner. A first conduit is configured to supply dopant gas to the gap where the dopant gas has a flow rate within the gap. A second conduit is configured to remove the dopant gas from the gap, wherein the flow rate of the dopant gas within the gap acts as a heat transfer media to regulate the temperature of the interior of the chamber.

12 Claims, 7 Drawing Sheets

TEMPERATURE CONTROLLED ION SOURCE

BACKGROUND OF THE INVENTION

1. Field of the Invention

Embodiments of the invention relate to the field of semiconductor device fabrication. More particularly, the present invention relates to an apparatus and method for controlling the temperature of an ion source within an ion implanter.

2. Discussion of Related Art

Ion implantation is a process used to dope impurity ions into a semiconductor substrate. An ion beam is directed from an ion source chamber toward a substrate. The depth of implantation into the substrate is based on the ion implant energy and the mass of the ions generated in the source chamber. A precise doping profile in the substrate is critical to proper device operation. One or more types of ion species may be implanted in different doses and at different energy levels to obtain desired device characteristics. FIG. 1 is a block diagram of an ion implanter 100 including an ion source chamber 102. A power supply 101 supplies the required energy to source 102 which is configured to generate ions of a particular species. The generated ions are extracted from the source through a series of electrodes 104 (extraction electrode assembly) and formed into a beam 95 which passes through a mass analyzer magnet 106. The mass analyzer is configured with a particular magnetic field such that only the ions with a desired mass-to-charge ratio are able to travel through the analyzer for maximum transmission through the mass resolving slit 107. Ions of the desired species pass from mass slit 107 through deceleration stage 108 to collimator magnet 110. Collimator magnet 110 is energized to deflect ion beamlets in accordance with the strength and direction of the applied magnetic field to form a ribbon-shaped beam targeted toward a work piece or substrate positioned on support (e.g. platen) 114. In some embodiments, a second deceleration stage 112 may be disposed between collimator magnet 110 and support 114. The ions lose energy when they collide with electrons and nuclei in the substrate and come to rest at a desired depth within the substrate based on the acceleration energy.

An indirectly heated cathode (IHC) ion source is typically used as the ion source chamber 102 in high current applications. FIG. 2 is a cross sectional block diagram generally illustrating an IHC ion source 200 including an arc chamber 201 defined by electrically conductive (e.g. tungsten) chamber walls. The chamber defines an ionization zone within which energy is imparted to a dopant feed gas to generate associated ions. Different feed gases are supplied to the ion source chamber to obtain plasma used to form ion beams having particular dopant characteristics. For example, the introduction of $H_2$, $BF_3$ and $AsH_3$ as the dopant gas at relatively high chamber temperatures are broken down into mono-atoms having high implant energies.

The IHC ion source chamber 200 includes a cathode/filament assembly 230 located at one end of the arc chamber 201. A filament 231 is positioned in close proximity to cathode 232 outside the arc chamber 201. A voltage is supplied to filament 231 which produces enough current through the filament to heat it and cause thermionic emission of electrons. Cathode 232 is indirectly heated via filament 231 by biasing the cathode more positively than the filament which causes these thermo-electrons to accelerate from filament 231 toward cathode 232, thereby heating the cathode 232. A repeller 210 is typically positioned on the opposite end of the arc chamber 201 and is biased to the same voltage as cathode 232. The emitted electrons are confined between the cathode 232 and repeller 210 which collide with the dopant feed gas introduced into the chamber via conduit 212 to generate plasma having the desired properties.

The ions 222 formed from the dopant gas are extracted from source chamber 200 via aperture 220 by way of, for example, a standard three (3) electrode configuration comprising plasma electrode 215, suppression electrode 216 and ground electrode 217 used to create an electric field. Although suppression electrode 216 is shown as being spaced apart from ground electrode 217, this is for illustrative purposes only and the electrodes are physically in contact with each other via insulators. Plasma electrode 215 may be biased at the same large potential as ion source chamber 200. Suppression electrode 216 is connected to a power supply and is typically biased at a moderate negative value to prevent electrons from entering back into source chamber 200. Ground electrode 217 is positioned downstream from suppression electrode 216 and is at ground potential. The strength of the electric field generated by the electrodes can be tuned to a desired beam current to extract a particular type of ion beam from the ions 222 generated in chamber 200.

FIG. 2A is a cross section of ion source 200 taken along lines A-A. Faceplate 262 includes aperture 220 through which beam 222 is extracted using extraction electrode assembly including suppression electrode 216, ground electrode 217 (and plasma electrode) as described above. The arc chamber 201 includes liners 250 disposed along sidewalls 260 and endplate 261. The walls of the chamber and the liners define a gap therebetween through which dopant gas, supplied via conduit 212, enters the chamber 201. These liners provide a low-cost consumable part that may be replaced as well as providing a uniform distribution of the dopant gas into the arc chamber, thereby providing more uniform and stable ion source operation. However, due to excessive source operation and the fact that these liners are thermally isolated from the walls of the arc chamber, the liners may become overheated. As a result, excessive sputtering and/or chemical etching causes particle generations which stick or deposit on the liners.

These same IHC ion sources may also be used for high-current (e.g. >100 mA extraction current) phosphorus implantations which require that the IHC ion source run at cooler-than-normal source temperatures to improve beam current and provide more stable implant profiles. Operating the IHC ion source at cooler-than-normal source temperatures also improves fractionization of the phosphorus ion species. However, the particles generated from the excessive sputtering and/or chemical etching may cause unstable ion source operation and beam extraction thereby compromising the desired beam profile. One alternative to overcome these problems is to utilize the source chamber without the liners, thereby making the source chamber somewhat cooler by eliminating thermally isolated hot spots. However, these thicker walls do not provide temperature-control capability for high current and high throughput operations. Thus, there is a need for an ion source that can be operated at a desired temperature for stable, high throughput ion implantations. In addition, there is a need to control the temperature of an ion source chamber by utilizing the same dopant gas for both temperature-control and dopant species generation.

SUMMARY OF THE INVENTION

Exemplary embodiments of the present invention are directed to an apparatus and method for controlling an ion source within an ion implanter. In an exemplary embodiment, an ion source includes a chamber having a wall that defines an interior surface. A liner is disposed within the chamber and has at least one orifice to supply the dopant gas to an inside of the chamber. A gap is defined between at least a portion of the interior surface of the chamber wall and the liner. A first conduit is configured to supply dopant gas to the gap where the dopant gas has a flow rate within the gap. A second conduit is configured to remove the dopant gas from the gap, wherein the flow rate of the dopant gas within the gap acts as a heat transfer media to regulate the temperature of the interior of the chamber.

In an exemplary method for controlling the temperature of an ion source chamber, a dopant gas is supplied into a gap of the ion source chamber where the gap is between a wall of the ion source chamber and a liner disposed within the chamber. A first portion of the dopant gas is supplied into the interior of the chamber via one or more orifices disposed through the liner. A second portion of the dopant gas is differentially pumped away from the gap such that a third portion of the dopant gas remaining within the gap provides a cooling media to control the interior temperature of the ion source chamber.

DESCRIPTION OF EMBODIMENTS

Figure 1:
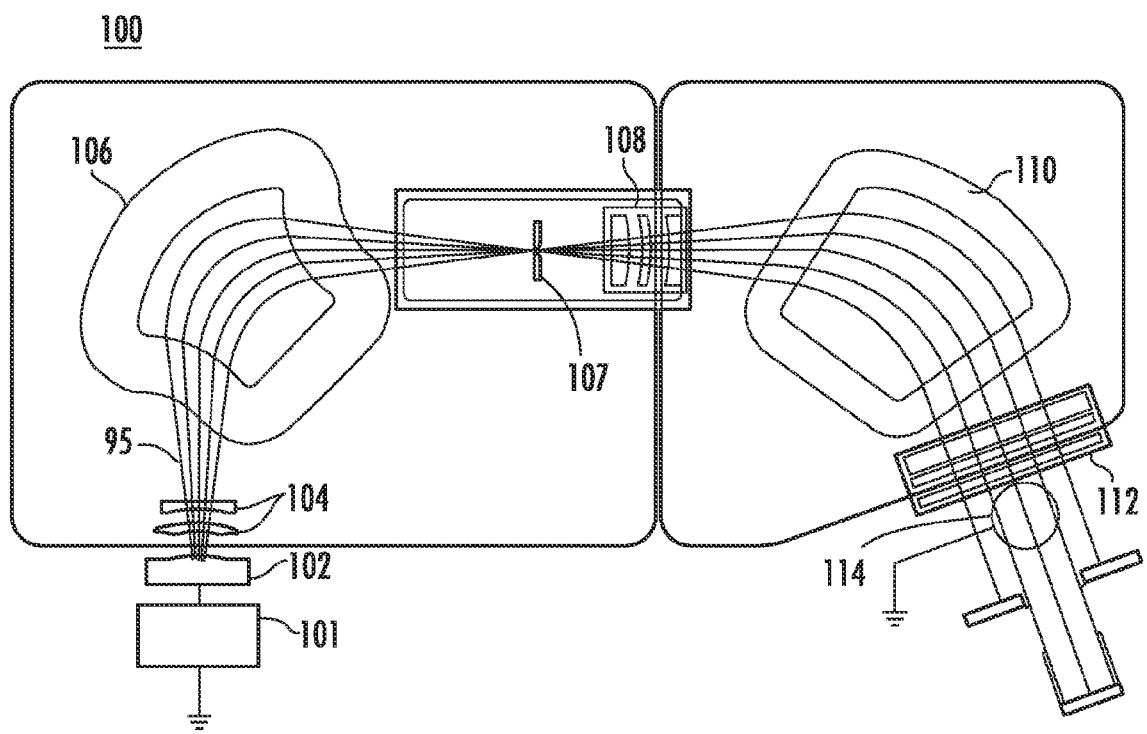
FIG. 1 illustrates a block diagram of a representative ion implanter.
Figure 2:
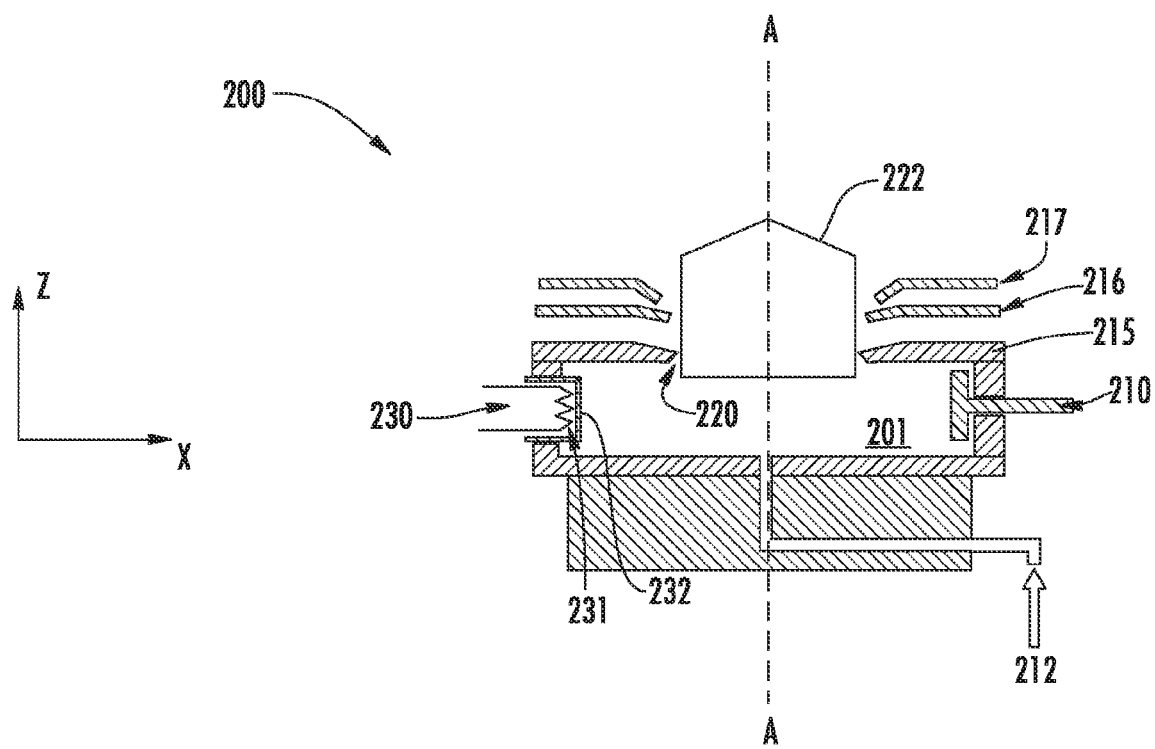
FIG. 2 is a cross sectional block diagram of a prior art ion source.
Figure 2A:
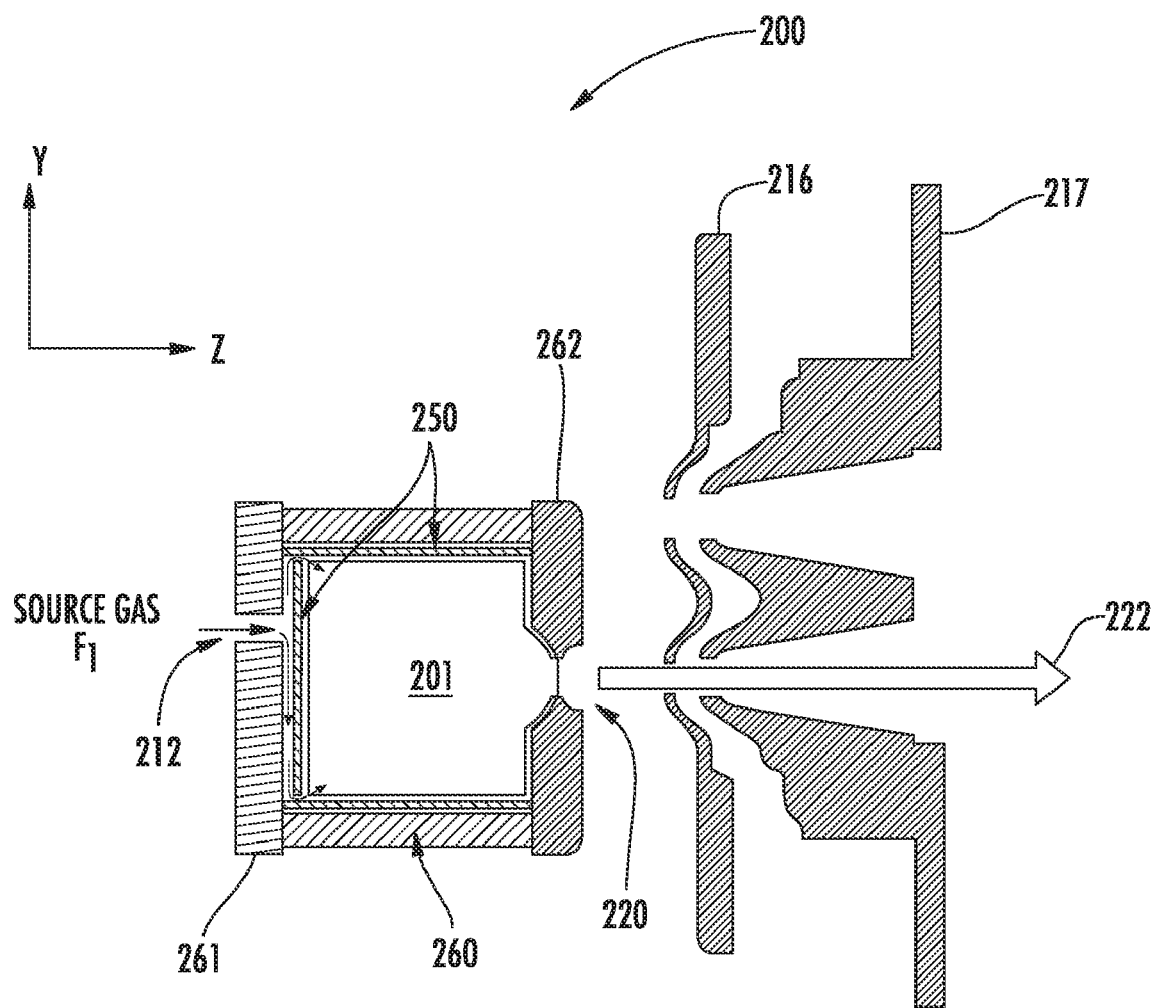
FIG. 2A is a cross section of ion source taken along lines A-A in FIG. 2.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3:
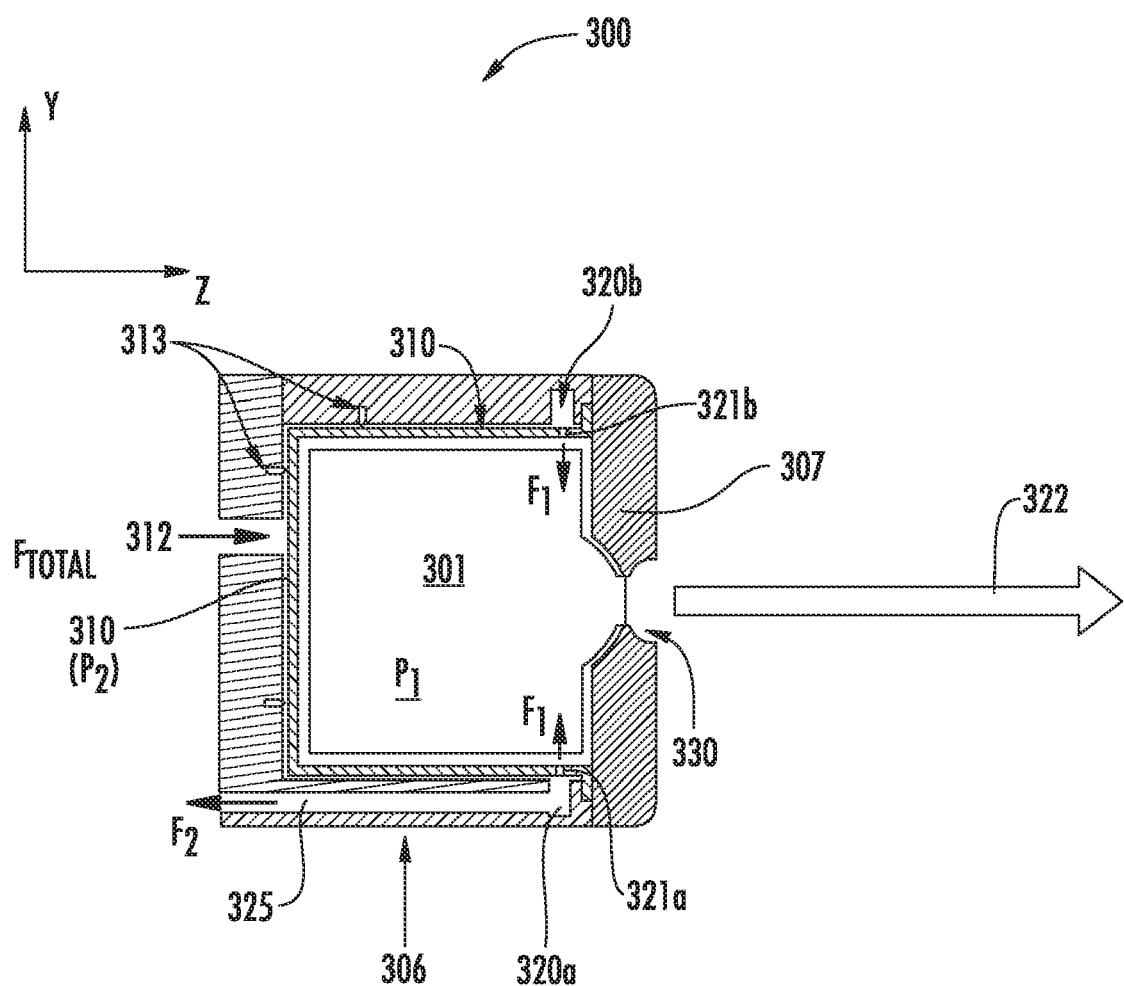
FIG. 3 is a block diagram of an exemplary ion source in accordance with an embodiment of the present disclosure.

FIG. 3 illustrates a simplified block diagram of an ion source chamber 300 utilized in an ion implanter shown in FIG. 1. The ion source chamber 300 utilizes the same dopant gas supplied to the chamber to generate the desired process plasma to also provide gas-cooling of the chamber walls during high throughput operations. By using the same gas to generate process plasma and for chamber temperature control, drawbacks associated with contamination between the dopant gas and a different cooling media are avoided.

In particular, ion source chamber 300 includes arc chamber 301 which may be, for example, a single-body chamber defined by walls 306 with faceplate 307. The chamber walls are typically made from stainless steel or aluminum and may include one or more passages within which liquid (e.g. water) flows to maintain a chamber wall temperature (e.g. <100° C.). A unitary liner 310 is disposed between the walls 306 and the interior of arc chamber 301 and extends to faceplate 307. The liner may be made from both thermally and electrically conductive materials such as, tungsten, molybdenum, tantalum, etc. Conduit 312 supplies dopant gas to be ionized within chamber 301. In particular, the dopant gas disperses in the gap defined between the liner 310 and walls 306. The gap between the source walls and the liner may be maintained by a plurality of spacers 313 and may have a dimension of, for example, 10-500 microns. A first pocket 320a and a second pocket 320b extend in chamber walls 306 used to provide uniform dopant gas distribution/injection into arc chamber 301 as well as providing uniform gas cooling as described below.

Figure 3A:
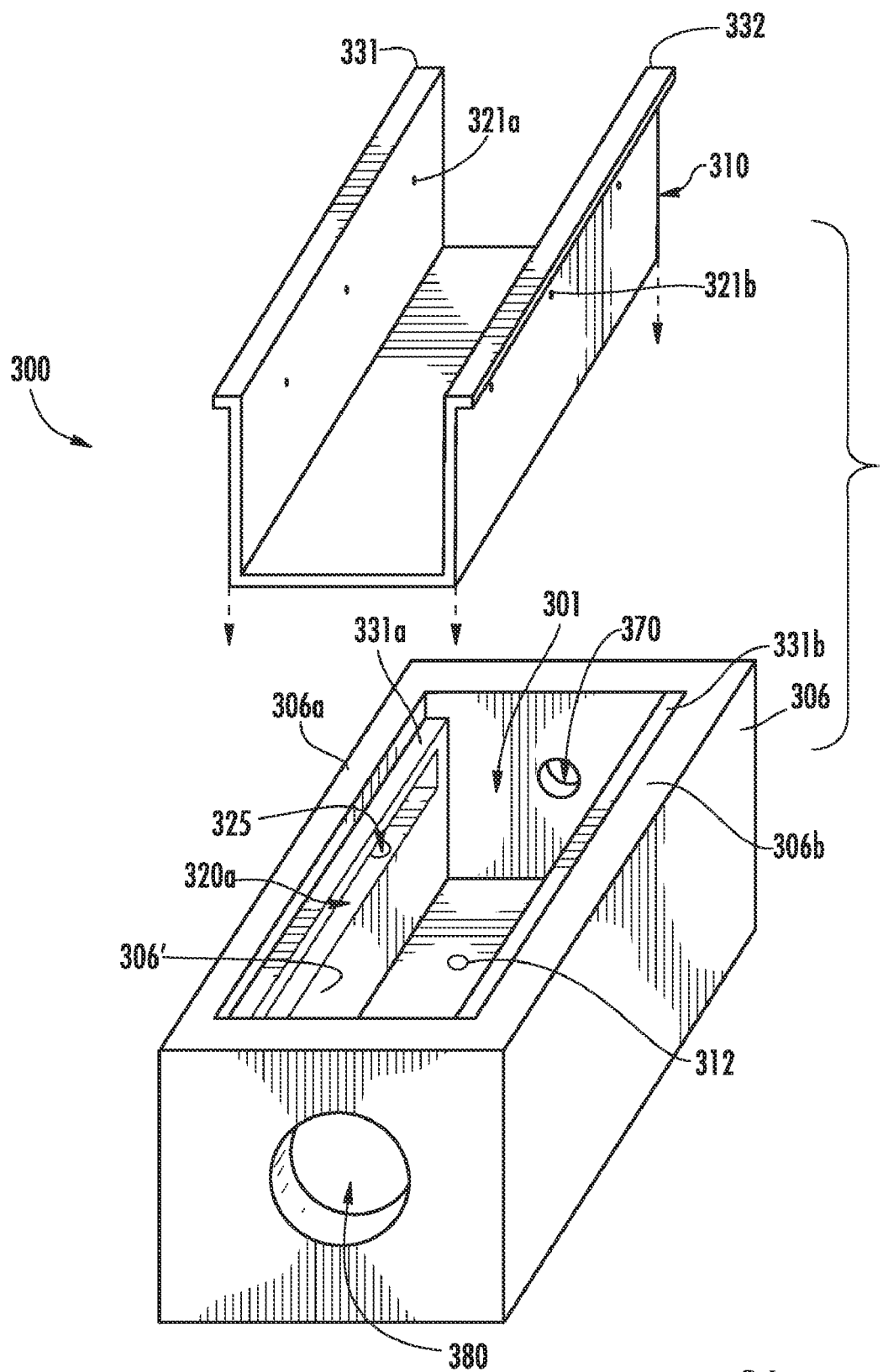
FIG. 3A is an exploded perspective view of the exemplary ion source chamber and associated liner shown in FIG. 3 in accordance with an embodiment of the present disclosure.

FIG. 3A is an exploded perspective view of the exemplary ion source chamber 300 shown in FIG. 3 formed by walls 306 and liner 310. Liner 310 is shown separate from the interior of arc chamber 301 for explanatory purposes, but is disposed within the chamber to form a gap between the liner 310 and the interior 306' of walls 306. As mentioned above, dopant gas is introduced into arc chamber 301 from conduit 312 via orifices 321a, 321b with differential pumping provided via conduit 325. First pocket 320a extends along the length of a longitudinal wall 306a of walls 306 and likewise, second pocket 320b (not shown in perspective view) extends along longitudinal wall 306b. When liner 310 is disposed in chamber 301, orifices 321a align with first pocket 320 to allow the dopant gas supplied to the pocket to enter chamber 301. Similarly, orifices 321b align with the second pocket to provide a uniform distribution of the dopant gas into the chamber. Chamber 300 includes an aperture 370 for the repeller and, at an opposite end, an aperture 380 for the cathode. Liner 310 includes ridge portions 331 and 332 which form a seal with corresponding notched areas 331a and 332b of chamber walls 306.

Returning to FIG. 3, the dopant gas supplied via conduit 312 is distributed into the gap between the chamber walls 306 and liner 310 at a flow rate designated as $F_{Total}$ and at a given pressure $P_2$ (also referred to as the gap pressure) defined by the gap dimension to cool the chamber liner 310 which in turn cools the temperature inside the arc chamber 301. In particular, the gap pressure $P_2$ is determined by the relationship among the flow of the supplied dopant gas $F_{Total}$, the flow rate $F_1$ of dopant gas into arc chamber 301 via orifices 321a, 321b and the flow rate $F_2$ associated with differential pumping via conduit 325. The gap distance determines thermal conductivity between 306 and 310, and consequently the temperature of the ion source. In terms of controlling the temperature of the ion source 300, the gap pressure $P_2$ is the key to control the ion source temperature and flow rate $F_1$ is the key to controlling the ion source pressure $P_1$. The pressures $P_1$ and $P_2$ can be independently controlled by adjusting the $F_{Total}$ flow rate and the differential pumping flow rate $F_2$.

Providing the dopant gas in the gap behind the cathode and repeller is less critical since the temperature of this area of the chamber has less of an effect on overall source operation. However, the connection of the liner 310 in the x direction (i.e. proximate the cathode and repeller) must limit dopant gas leakage from compromising the flow rates ($F_{Total}$, $F_1$ and $F_2$) as well as the pressures ($P_1$ and $P_2$) within the chamber.

As the dopant gas is supplied via conduit 312, a first portion of the dopant gas fills pockets 320a, 320b and enters the arc chamber 301 at a flow rate $F_1$ via orifices 321a, 321b. These orifices have a given dimension to regulate the flow of gas into arc chamber 301 to provide a gas pressure $P_1$ within the source chamber 301 for plasma generation. Additional orifices having varying dimensions may also be employed to control the supply of dopant gas into arc chamber 301. A second portion of the dopant gas is pumped out via differential pumping conduit 325 at a controlled flow rate ($F_2$). In this manner, the dopant gas that flows around the gap formed between the walls 306 and liner 310 serves as a heat transfer media to cool the liner 310 and consequently the interior of the arc chamber 301 during high throughput operation. Thus, the total flow rate of the dopant gas is given by $F_{Total} = F_1 + F_2$. The gap pressure $P_2$ determines the thermal conductivity between chamber walls 306 and liner 310 thereby determining the determining the source temperature. The differential flow rate $F_2$ can be varied independently to provide differential pumping. Thus, the gap pressure $P_2$ and the flow rate $F_1$ can be independently controlled to provide the optimum source operating condition for a given process. The ions formed from the dopant gas are extracted from source chamber 300 via aperture 330.

The pressure inside arc chamber 301 is determined by the flow rate $F_1$ of the dopant gas through the orifices 321a, 321b of liner 310 during ion extraction to form beam 322. The gap pressure ($P_2$) of the dopant gas between the liner 310 and the walls 306 is dependent on the flow rate of the dopant gas ($F_{Total}$) via conduit 312, the flow rate of the dopant gas into the arc chamber ($F_1$) and the dimension of the gap between the liner 310 and the walls 306. This gap pressure ($P_2$) determines the amount of thermal conductance between the chamber walls 306 and liner 310. Accordingly, by altering the configuration of the source chamber 300 including the chamber wall 306 to liner 310 gap dimension, and the orifice 321a and 321b dimensions, as well as adjusting the flow rate of the dopant gas ($F_{Total}$) and the differential pumping flow rate ($F_2$), the chamber 300 can operate at desired conditions for a given type of dopant gas and dopant profile. For example, if a desired dopant profile requires high beam current, this typically requires a high flow rate of dopant gas into the arc chamber ($F_1$) as well as a high gap pressure ($P_2$) between the liner 310 and the walls 306. This may be accomplished by increasing the flow of dopant gas ($F_{Total}$) into chamber 300 while keeping the differential pumping flow ($F_2$) constant. Over time, the components of the source chamber 300 may wear. In particular, the dimensions of orifices 321a, 321b may change (e.g. smaller due to deposits in the orifices) which alters the flow rate ($F_1$) into arc chamber 301 for a given dopant gas flow rate ($F_{Total}$). By altering one or both of the dopant gas flow rate ($F_{Total}$) and the differential pumping flow rate ($F_2$), the arc chamber flow rate ($F_1$) may be maintained.

Figure 4:
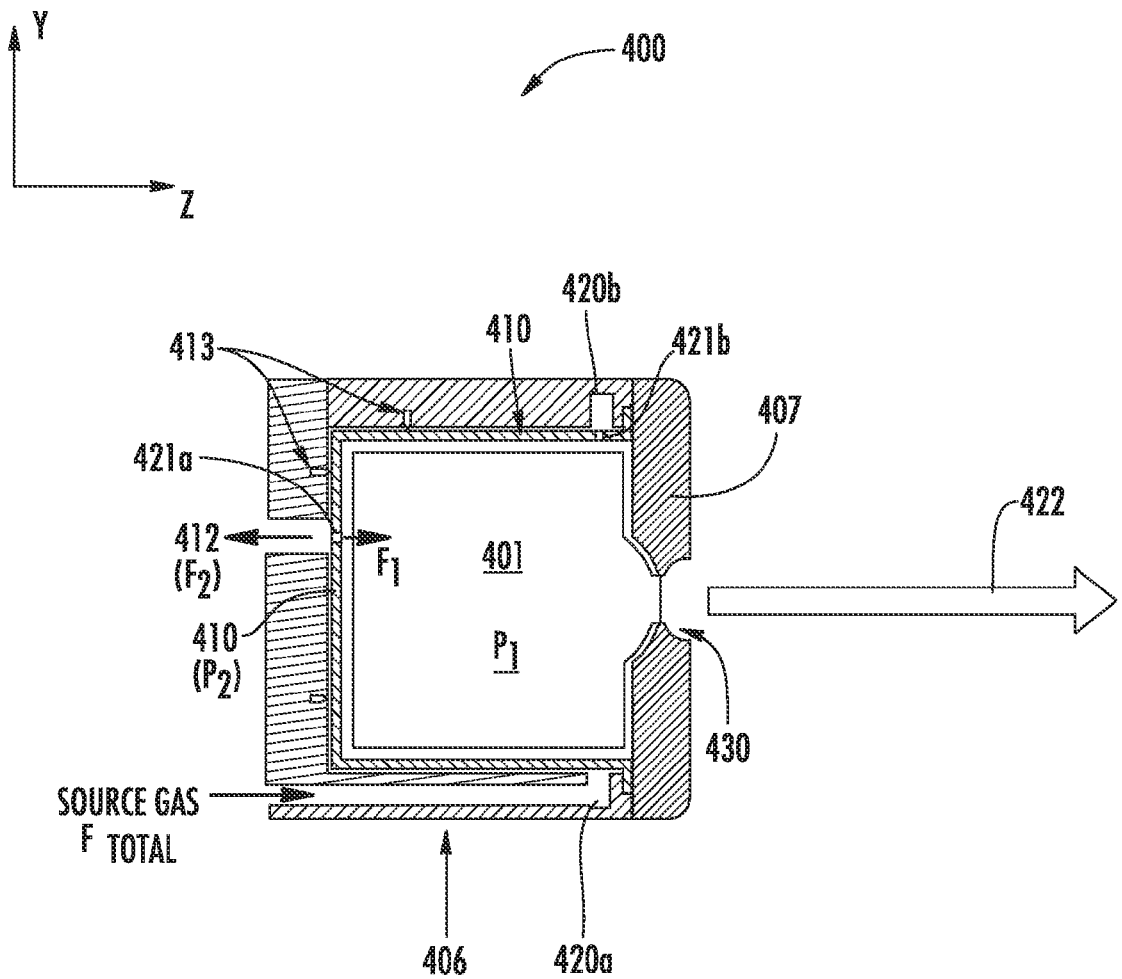
FIG. 4 is a block diagram of an exemplary ion source in accordance with an embodiment of the present disclosure.

FIG. 4 is a block diagram of an alternative embodiment of an ion source chamber 400 utilizing a reverse gas flow configuration as compared to the ion source chamber of FIG. 3. In particular, ion source chamber 400 includes arc chamber 401 defined by walls 406 with faceplate 407. Again, the walls 406 of the chamber may be maintained at a given temperature based on the use of one or more passages through the chamber walls within which a liquid (e.g. water) is supplied. Liner 410 is disposed between the walls 406 and the interior of the arc chamber. In this embodiment, conduit 425 supplies the dopant gas ($F_{Total}$) to be ionized within chamber 401 and conduit 412 provides differential pumping of the supplied dopant gas at a given flow rate ($F_2$). The dopant gas is introduced into chamber 401 via conduit 425 at a flow rate ($F_{Total}$) and at a given gap pressure $P_2$ defined by the gap dimension between the chamber walls 406 and liner 410. The gap between the wall 406 and the liner 410 may be maintained by a plurality of spacers 413. A first portion of the dopant gas fills pockets 420a, 420b and enters the arc chamber 401 at a flow rate $F_1$ via orifices 421a, 421b through liner 410. Similar to orifices 321a, 321b of FIG. 3, these orifices have a given dimension to regulate the flow ($F_1$) of dopant gas into arc chamber 401. An amount of the dopant gas is pumped out via differential pumping conduit 412 at a controllable flow rate ($F_2$). In this manner, the dopant gas that flows around the gap formed between the walls 406 and liner 410 serves as a heat transfer media to cool the walls 406 of the arc chamber 401 during high throughput operation. Thus, the total flow rate of the dopant gas is given by $F_{Total} = F_1 + F_2$. The ions formed from the dopant gas are extracted from source chamber 400 via aperture 430.

Figure 5:
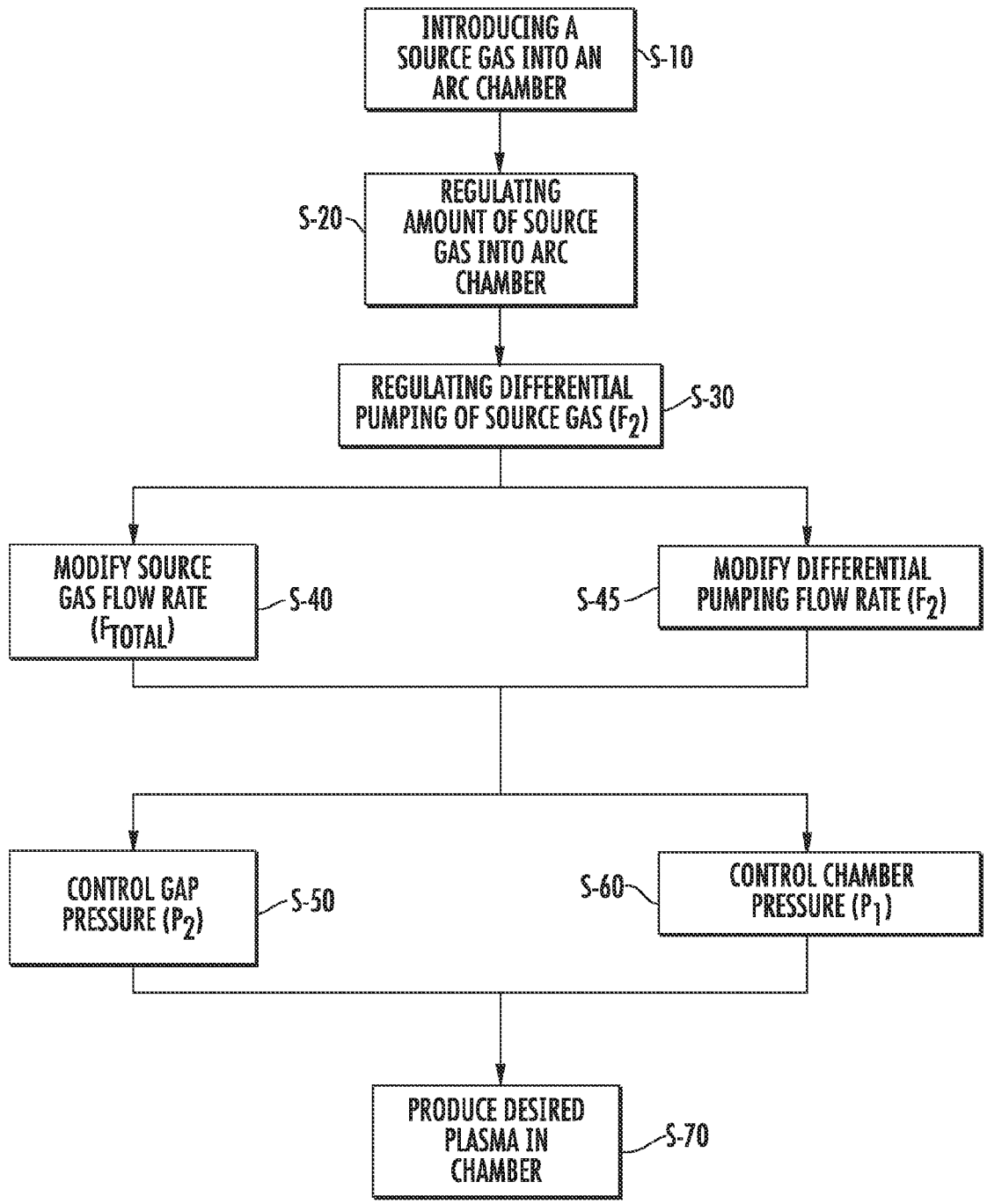
FIG. 5 is a flow chart illustrating an exemplary method of controlling the temperature of an ion source chamber in accordance with an embodiment of the present disclosure.

FIG. 5 is a flow chart illustrating the above described process of cooling an ion source chamber utilizing process dopant gas instead of a separate cooling gas or other media. A dopant gas such as, for example, BF3, PH3, etc., is supplied to the arc chamber at step S-10. The dopant gas is dispersed within the gap formed between the chamber walls and the liner as well as filling the pockets formed in the chamber walls. At step S-20, the amount of dopant gas supplied into the arc chamber (F1) is regulated by the size of the orifices (e.g. orifices 321a, 321b, 421a, and 421b) as well as the flow of dopant gas ($F_{Total}$) and differential pumping ($F_2$). In particular, the differential pumping of the dopant gas to control the flow ($F_2$) away from the chamber 300 is performed at step S-30. A determination is made at step S-40 whether or not to modify the dopant gas flow rate ($F_{Total}$) and/or the differential pumping flow rate ($F_2$) at step S-45 to maintain the flow rate ($F_1$) of dopant gas into the arc chamber. In addition, at step S-50 the gap pressure ($P_2$) is controlled by the supply of dopant gas ($F_{Total}$) and the gap dimension. At step S-60, the chamber pressure ($P_1$) is controlled by the flow of dopant gas through the orifices into the arc chamber. The combination of these steps contributes to cooling of the inside of the arc chamber to produce the desired plasma at step (S-70) and consequently the extraction of a desired beam profile.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A method for controlling a temperature of an ion source chamber comprising:
   supplying a dopant gas into a gap of said ion source chamber, said gap defined between a wall of said ion source chamber and a liner disposed within said chamber;
   supplying a first portion of said dopant gas into an interior of said chamber via one or more orifices disposed through said liner; and
   differentially pumping a second portion of said dopant gas away from said gap such that a third portion of the dopant gas remaining within said gap provides a cooling media to control the temperature of the interior of said chamber.

2. The method of claim 1 further comprising regulating the flow of said dopant gas into the interior of said chamber by modifying the differential pumping rate.

3. The method of claim 1 further comprising regulating the flow of said dopant gas into the interior of said chamber by modifying the supply of dopant gas to said gap.

4. An ion source comprising:
   a chamber having a wall that defines an interior surface;

a liner disposed within said chamber, said liner having at least one orifice to supply dopant gas to an inside of said chamber, said dopant gas used to provide ions emitted from said chamber;

a gap defined between at least a portion of the interior surface of said chamber and said liner;

a first conduit configured to supply dopant gas to said gap, said dopant gas having a flow rate within said gap; and a second conduit connected to said gap and configured to remove said dopant gas from said gap, wherein the flow rate of said dopant gas within said gap acts as a heat transfer media to regulate the temperature of the interior of said chamber.

5. The ion source of claim 4 further comprising a pocket disposed within said chamber wall, said pocket configured to receive said dopant gas flowing through said gap, said pocket further configured to allow uniform dopant gas distribution within said gap thereby providing uniform temperature distribution in the source chamber.

6. The ion source of claim 5 wherein said pocket is a first pocket, said ion source further comprising a second pocket disposed within said chamber wall, said second pocket configured to receive said dopant gas flowing through said gap, said second pocket further configured to allow uniform dopant gas distribution within said gap thereby providing uniform temperature distribution in the source chamber.

7. The ion source of claim 4 further comprising a plurality of spacers disposed between said liner and said chamber wall at least around a portion of a perimeter of said gap.

8. The ion source of claim 4 further comprising an indirectly heated cathode located at a first end of said chamber configured to emit electrons within said chamber.

9. The ion source of claim 8 further comprising a repeller located within a second end of said chamber, said emitted electrons confined between said cathode and said repeller which collide with said dopant gas supplied to the interior of said chamber via said at least one orifice to generate plasma therein.

10. The ion source of claim 9 wherein said chamber further comprising an aperture through which ions from said plasma are extracted.

11. The ion source of claim 5 wherein said pocket extends substantially a length of said wall.

12. The ion source of claim 6 wherein said second pocket extends substantially a length of said wall.

\* \* \* \* \*